United States Patent
Stone

(10) Patent No.: US 12,264,562 B2
(45) Date of Patent: *Apr. 1, 2025

(54) METHOD FOR OBTAINING UNIQUE CONSTRAINTS TO ADJUST FLOW CONTROL IN A WELLBORE

(71) Applicant: Schlumberger Technology Corporation, Sugar Land, TX (US)

(72) Inventor: Terry Wayne Stone, Abingdon (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/500,283

(22) Filed: Nov. 2, 2023

(65) Prior Publication Data
US 2024/0060402 A1    Feb. 22, 2024

Related U.S. Application Data

(63) Continuation of application No. 15/733,434, filed as application No. PCT/US2019/016480 on Feb. 4, 2019, now Pat. No. 11,808,117.

(Continued)

(51) Int. Cl.
*E21B 43/12*        (2006.01)
*E21B 34/02*        (2006.01)
(Continued)

(52) U.S. Cl.
CPC ............ *E21B 43/12* (2013.01); *E21B 34/025* (2020.05); *G05D 7/06* (2013.01); *G06F 30/20* (2020.01)

(58) Field of Classification Search
CPC ........ E21B 43/12; E21B 34/025; G06F 30/20; G05D 7/06
See application file for complete search history.

(56) References Cited

U.S. PATENT DOCUMENTS

| 7,668,707 B2 | 2/2010 | Watts, III |
| 8,224,634 B2 | 7/2012 | Watts, III |

(Continued)

FOREIGN PATENT DOCUMENTS

WO    WO2007058662 A1    5/2007

OTHER PUBLICATIONS

Stone TW, Wardell-Yerburgh P, Dyer SJ, Mikhailov D, Kotlyar L, Neylon KJ, Moen T, Tonkin T. Flow Control Valves and Inflow Control Devices Optimized for Wellbore Cleanup and Production. InInternational Petroleum Technology Conference Dec. 10, 2014. OnePetro. (Year: 2014).*

(Continued)

*Primary Examiner* — Chuen-Meei Gan
(74) *Attorney, Agent, or Firm* — Aashish Y. Chawla

(57) ABSTRACT

A method may include obtaining data representing flow rates for a plurality of flow control devices. The method also includes determining total molar rates for a plurality of flows through pipe segments associated with each of the flow control devices based on the obtained data. The method also includes determining initial flow control device constraints based on the total molar rates for the plurality of flow control devices. The method also includes determining that one or more wellhead constraints would be violated based on the flow control device constraints. The method also includes determining adjusted flow control device constraints that result in the satisfaction of one or more wellhead constraints or constraints of others of the plurality of flow control devices. The method also includes determining an adjusted flow rate based on the adjusted device constraints that satisfy the wellhead and the flow control device constraints.

15 Claims, 6 Drawing Sheets

Related U.S. Application Data

(60) Provisional application No. 62/625,614, filed on Feb. 2, 2018.

(51) Int. Cl.
*G05D 7/06* (2006.01)
*G06F 30/20* (2020.01)

(56) References Cited

U.S. PATENT DOCUMENTS

| | | |
|---|---|---|
| 11,808,117 B2 | 7/2023 | Stone |
| 2006/0176640 A1 | 8/2006 | Dykstra |
| 2011/0320047 A1* | 12/2011 | Stone .................. E21B 43/00 703/2 |
| 2014/0149098 A1 | 5/2014 | Bowen |
| 2015/0134127 A1 | 5/2015 | Fleming |
| 2018/0285515 A1* | 10/2018 | Isichei .................. E21B 49/00 |

OTHER PUBLICATIONS

Stone T, McKee F, Istchenko C. Boundary Segments for Multisegment Well Models. InSPE Reservoir Simulation Conference Mar. 29, 2019. OnePetro. (Year: 2019).*
Holmes JA, Byer T, Edwards DA, Stone TW, Pallister I, Shaw G, Walsh D. A unified wellbore model for reservoir simulation. InSPE Annual Technical Conference and Exhibition Sep. 19, 2010 (pp. SPE-134928). SPE. (Year: 2010).*
Search Report and Written Opinion of International Patent Application No. PCT/US2019/016480 dated May 20, 2019, 10 pages.
International Preliminary Report on Patentability mailed Aug. 13, 2020 in International Application No. PCT/US2019/016480, 9 pages.

* cited by examiner

```
wellDef "HORP" {
    ConstraintDevice "downhole_control_mode_2" {
        Type=DOWNHOLE_VALVE
        SegmentPipe=22
        Constraints=[
            data              property
            50                PRESSURE
            -30.0             COMPONENT_FLOW_RATE['METHANE']
            1.0               COMPONENT_QUALITY['METHANE']
            -3333             COMPONENT_FLOW_RATE[3]
            0.79              COMPONENT_QUALITY[3]
            250               TUBING_HEAD_TEMPERATURE
            12                TUBING_HEAD_PRESSURE
            0.0001            LIQUID_FLOW_RATE
        ]
    }
}
```

FIG. 4

```
wellDef "INJ_MSW" {
    ConstraintDevice "dual_tubing" {
        Type=DOWNHOLE_VALVE
        SegmentPipe=41
        Constraints=[
            data              property
            35                PRESSURE
            -100.0            WATER_FLOW_RATE
            0.95              STEAM_QUALITY
            275               TUBING_HEAD_TEMPERATURE
        ]
    }
}
```

FIG. 5

METHOD FOR OBTAINING UNIQUE CONSTRAINTS TO ADJUST FLOW CONTROL IN A WELLBORE

RELATED APPLICATIONS

This application is a continuation of co-pending U.S. patent application Ser. No. 15/733,434 with a 371(c) date of 29 Jul. 2020 (published as US 2021/0262325), which is a national stage entry of international patent application no. PCT/US2019/016480 filed on 4 Feb. 2019, which claims priority to and benefit of a US Provisional Application having Ser. No. 62/625,614, filed 2 Feb. 2018. The above applications are incorporated herein by reference.

BACKGROUND

Modern wells are becoming increasing long with multiple sidetracks and multiple downhole devices. Such devices may include flow control valves that may be operated in accordance with a control mode either automatically, manually, or remotely. Used to control multiple zones selectively, flow control devices may reduce water cut and gas cut, minimize well interventions, and maximize well productivity. Some techniques to switch control modes at the wellhead may not be adequate as they are not robust enough to handle additional downhole flow control valve constraints. In some situations, conflicts may arise between surface and downhole control points, possibly resulting in non-unique solutions for controlling flow rates.

SUMMARY

The present disclosure includes example embodiments of a method to simultaneously evaluate multiple constraints at each downhole flow control device. Aspects of the present disclosure may include methods, computing systems, and/or a computer-readable media for determining flow control device settings. The method may include obtaining data representing flow rates for a plurality of flow control devices; determining total molar rates for a plurality of flows through pipe segments associated with each of the flow control devices based on the obtained data; determining initial flow control device constraints based on the total molar rates for the plurality of flow control devices; determining that one or more wellhead constraints would be violated based on the flow control device constraints; determining adjusted flow control device constraints that result in the satisfaction of one or more wellhead constraints or constraints of others of the plurality of flow control devices; determining an adjusted flow rate based on the adjusted device constraints that satisfy the wellhead and the flow control device constraints; and executing a computer-based instruction to set one or more wellhead settings and flow control device valve settings based on the adjusted flow control device constraints.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIG. 4 illustrates an example of code where multiple components are injected including steam and methane using a mechanism to set multiple DOWNHOLE_VALVE constraints, according to an embodiment.

FIG. 5 illustrates an example of code where a pressure constraint and a steam rate constraint at a specified temperature and quality are set, according to an embodiment.

DETAILED DESCRIPTION

Figure 1A:
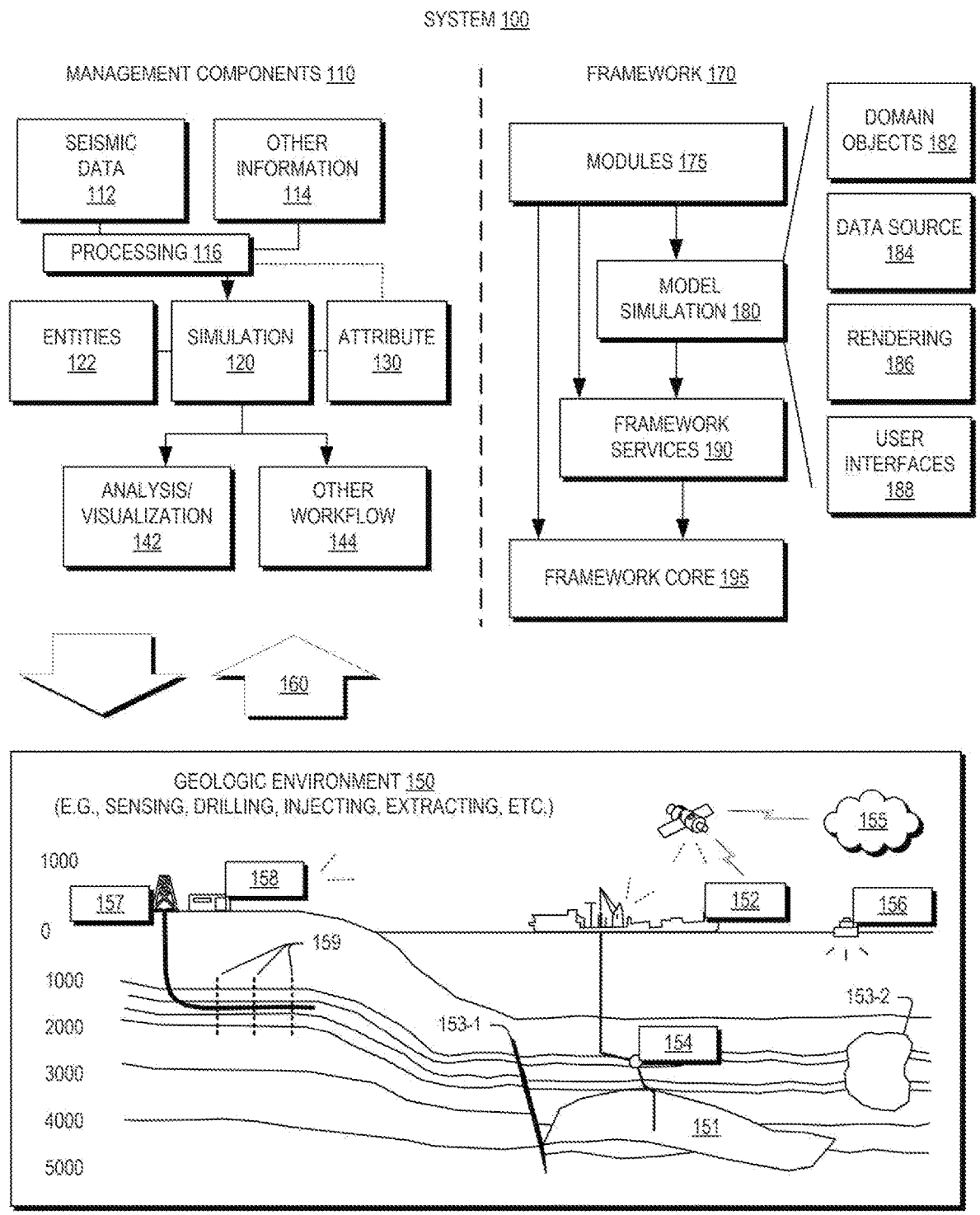
FIG. 1A illustrates an example of a system that includes various management components to manage various aspects of a geologic environment, according to an embodiment.

Aspects of the present disclosure provide example techniques for simultaneously evaluating multiple constraints at each downhole flow control device (e.g., electronically-controlled valve and/or other type of flow control device). In some implementations, constraints may include, for example, an external pressure constraint, a surface or downhole flow rate such as liquid flow rate constraint, a steam rate constraint, or the like. Aspects of the present disclosure may determine whether the flow control device constraints (e.g., as determined by total molar rates for the flow control devices) satisfy each of multiple wellhead constraint thresholds (e.g., whether the flow control device constraints are in violation of the wellhead constraint thresholds). If the flow control device constraints do not satisfy the wellhead constraint thresholds (e.g., are in violation of one or more of the wellhead constraints), aspects of the present disclosure may determine an adjusted flow such that the flow control device constraints satisfy the wellhead constraint thresholds (e.g., are no longer in violation). That is, aspects of the present disclosure may solve the well to obtain unique constraints at all control points for adjusting flow. In some implementations, aspects of the present disclosure may be employed to evaluate flow control devices modelled as segments in a multi-segment well model or as actually deployed in a wellbore during real-time field operations.

Aspects of the present invention may determine a unique set of control modes for the wellhead when solving for a well, while using multiple downhole flow control devices. More specifically, aspects of the present disclosure may periodically and/or intermittently adjust flow through the simultaneous evaluation of flow control device constraints.

In some implementations, aspects of the present disclosure may include a system and/or method that obtains data (e.g., flow-related data) that represents measured or modeled flow rates and pressure-volume-temperature characteristics for flow control devices. In some implementations, aspects of the present disclosure may determine total molar rates for a plurality of flows through pipes associated with each of the flow control devices (e.g., based on the obtained flow-related data); determine device constraints based the total molar rates for the flow control devices; determine that device constraints do not satisfy wellhead constraint thresholds; determine an adjusted flow such that device constraints satisfy wellhead and device constraint thresholds; and execute computer-based instruction to electronically adjust flow control device based on determined adjusted flow In some implementations, aspects of the present disclosure may apply for both real-time and computer simulation operations.

Reference will now be made in detail to embodiments, examples of which are illustrated in the accompanying drawings and figures. In the following detailed description, numerous specific details are set forth in order to provide a thorough understanding of the invention. However, it will also be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1A illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1A, the management components 110 include a seismic data component 112, an additional information component 114 (e.g., well/logging data), a processing component 116, a simulation component 120, an attribute component 130, an analysis/visualization component 142 and a workflow component 144. In operation (e.g., in real-time field operation), seismic data and other information provided per the components 112 and 114 may be input to the simulation component 120. In some implementations, one or more functions described as being performed by the simulation component 120 may be performed by a real-time well control device in a field operation.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc. Equally in another example embodiment, entities 122 may include real-time visualization and/or other engineering model designed to facilitate real-time well control.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1A, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In another example embodiment, a real-time well control in a field operation may construct other, calculated models of the geologic environment 150, which may be used to simulate behavior of the geologic environment 150. In the example of FIG. 1A, the analysis/visualization component 142 may allow for interaction with a model or model-based results (e.g., simulation results or real-time field data, etc.). As an example, output from the simulation component 120 may be input to one or more other workflows, as indicated by a workflow component 144.

As an example, the simulation component 120*a* may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1A also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1A, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1A, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1A, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remotely from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1A shows a satellite in communication with the network 155 that may be configured for communications, noting that the satellite may additionally or instead include circuitry for imagery (e.g., spatial, spectral, temporal, radiometric, etc.).

FIG. 1A also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a real-time or simulation calculation may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.). As an example, a workflow may include one or more steps needed to visualize or model real-time field data in order for the field engineer to make informed, on-site decisions for operating actual wells in an oilfield.

Figure 1B:
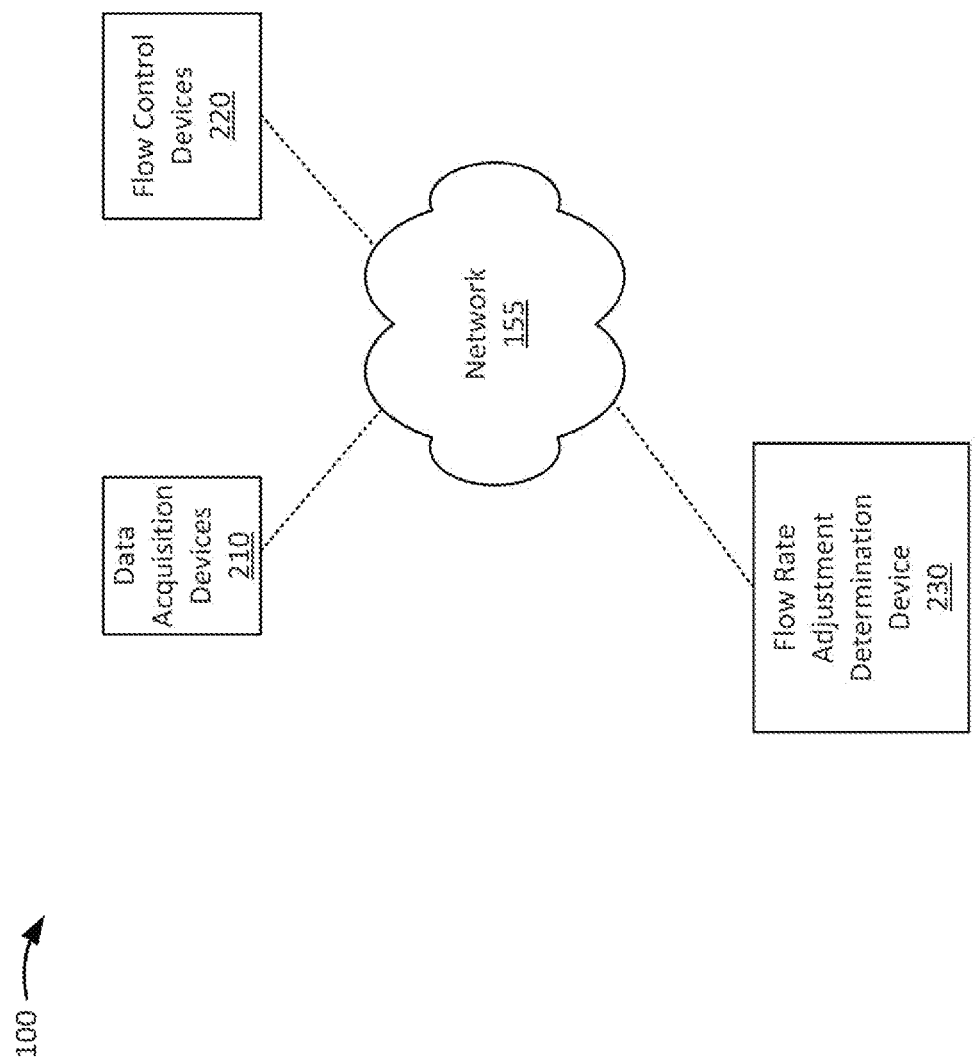
FIG. 1B illustrates one or more additional components of the example system of FIG. 1A.

FIG. 1B illustrates one or more additional components of the system 100. In some implementations, system 100 may further include data acquisition devices 210, one or more flow control devices 220, and a flow rate adjustment determination device 230. As shown in FIG. 1B, the data acquisition devices 210, the flow control devices 220, and the flow rate adjustment determination device 230 may communicate via the network 155.

The data acquisition devices 210 may include one or more downhole flow meters, piezo meters, pressure sensors, temperature measurement devices, or the like. In some implementations, the data acquisition devices 210 obtain raw sensor data relating to flow rates and/or pressure-volume-temperature characteristics of the flow control devices 220.

The flow control devices 220 may include one or more valves and/or other devices that may be operated automatically, manually, or remotely for controlling the flow rates of fluids (e.g., in a wellbore). Used to control multiple zones selectively, the flow control devices 220 may reduce water cut and gas cut, minimize well interventions, and maximize well productivity. As described herein, the flow control devices 220 may receive control instructions from the flow rate adjustment determination device 230 to adjust its valve opening and hence, flow rates, or may simply remain static until such time as a well intervention may alter the device setting.

The flow rate adjustment determination device 230 may include one or more computing and/or server devices that obtains data (e.g., flow-related data from the data acquisition devices 210) that represents measured or modeled flow rates and pressure-volume-temperature characteristics for flow control devices. In some implementations, the flow rate adjustment determination device 230 may determine total molar rates for a plurality of flows through pipes associated with each of the flow control devices (e.g., based on the obtained flow-related data); determine device constraints based the total molar rates for the flow control devices; determine that device constraints do not satisfy wellhead constraint thresholds; determine an adjusted flow such that device constraints satisfy wellhead constraint thresholds; and execute computer-based instruction to electronically adjust flow control device based on determined adjusted flow (e.g., by outputting a control instruction to the flow control devices 220).

Figure 2:
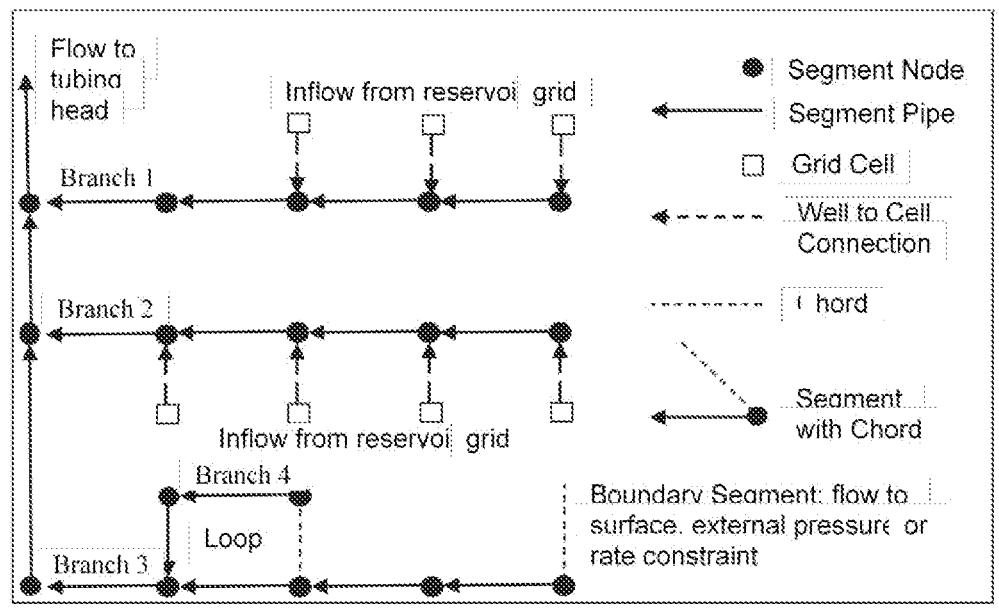
FIG. 2 illustrates a schematic of a complex well model that includes lateral branches, loops, connecting flows to the reservoir and also boundary segments, according to an embodiment.

FIG. 2 illustrates a schematic of an example well model that includes lateral branches, loops, connecting flows to the reservoir and also boundary segments, according to an embodiment. In the example of FIG. 2, inflow from reservoir grid cells may flow to, or outflow to reservoir grid cells may flow from segment nodes via well to cell connections. Segment pipes may connect the segment nodes and form flow paths that may include branches that ultimately route flow to a tubing head. In some implementations, the well model may include a boundary segment, which may refer to a chord at a boundary of the well model. In some implementations, the boundary segment may be constrained based on flow to surface, external pressure, and/or flow rate.

In the example of FIG. 2, flow control devices 220 may be implemented at any location within segment pipes, connection from grid cells, inflows from or outflow to reservoir grids, chords, and/or loops. In this way, aspects of the present disclosure may control the flow control devices 220 at any location within a wellbore system to reduce inflowing water cut and gas cut, minimize well interventions, and maximize well productivity, or provide a more even wellbore pressure profile and/or outflow to the reservoir. Further, flow rate data from any branch, loop, segment, and/or boundary segment may be obtained and considered when determining flow rate adjustments.

Figure 3:
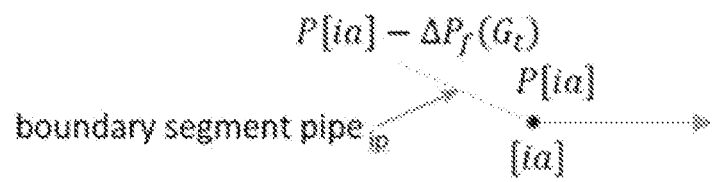
FIG. 3 illustrates an example of additional details on the boundary segments, according to an embodiment.

FIG. 3 illustrates additional details on boundary segments (as shown in FIG. 2) according to an embodiment. More specifically, FIG. 3 includes an expression representing a pressure constraint at the boundary segment. Additional details regarding the pressure constraint at the boundary segment are described in greater detail herein.

FIG. 4 illustrates an example of multiple constraints that may be set on a boundary segment. In the example of FIG. 4, multiple components may be injected, such as steam and methane using a mechanism to set multiple DOWNHOLE_VALVE constraints. In some implementations, these constraints may be determined by a modeler (e.g., embedded in reservoir modeling software) and/or other engine that is used to control real-time or modelled wells. More specifically, the constraints may be determined by field operations engineers remotely and/or located at an operation site in order to control other types of constraints on surface facilities, health and safety, breakdown and erosion, etc., and/or for the purposes of history matching historical data FIG. 5 illustrates an example where a pressure constraint and a steam rate constraint at a specified temperature and quality are set. In some implementations, these constraints may be set according to pre-determined or real-time modeling of overall recovery. Additionally, or alternatively, the pressure constraints may be based on constraints on surface facilities including boiler capacity for multiple steam injectors, availability of water to produce steam, field pressure considerations in the reservoir region containing multiple steam injectors, etc.

Figure 6:
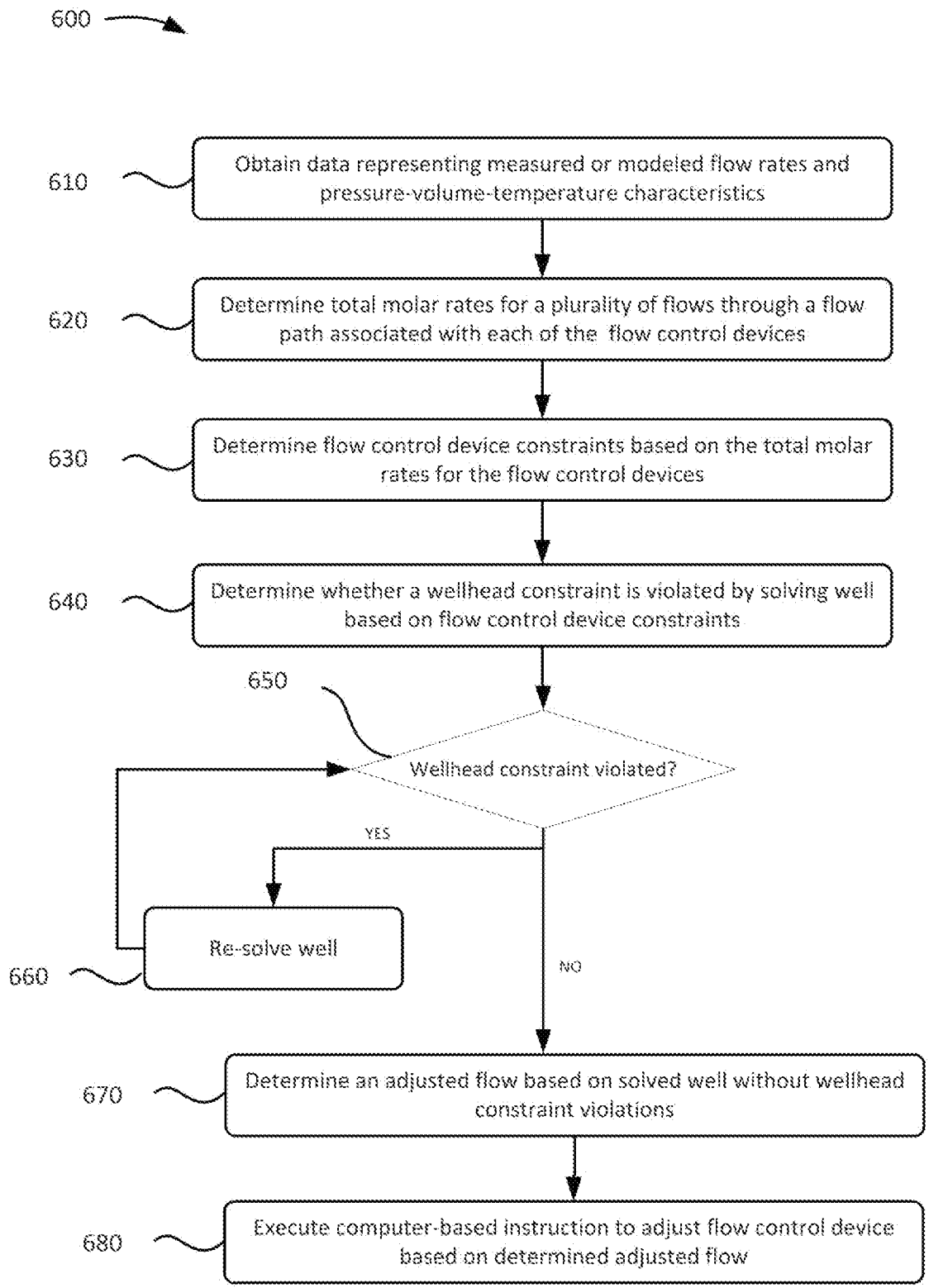
FIG. 6 shows an example flowchart of a process for determining adjusted flow rates based on evaluating and obtaining multiple constraints at each flow control device that do not violate wellhead constraints, according to an embodiment.

FIG. 6 shows an example flowchart of a process for determining adjusted flow rates based on evaluating and obtaining multiple constraints at each flow control device that do not violate wellhead constraints. The steps of FIG. 6 may be implemented in the environment of FIGS. 1A and 1B, for example, and are described using reference numbers of elements depicted in FIGS. 1A and 1B. As noted above, the flowchart illustrates the architecture, functionality, and operation of possible implementations of systems, methods, and computer program products according to various embodiments of the present disclosure.

As shown in FIG. 6, process 600 includes obtaining data that represents measured or modeled flow rates and pressure-volume-temperature characteristics (block 610). For example, the flow rate adjustment determination device 230 may obtain raw data from the data acquisition devices 210 in which the raw data may include information representing flow rates measured upstream, downstream and/or within the flow control devices 220. Additionally, or alternatively, the raw data may include pressure, temperature, etc. In some implementations, the flow rate adjustment determination device 230 may model the raw data and/or obtain modeled data by applying a simulator or other modelling tool to the raw data to model flow rate, pressure-volume-temperature characteristics or the like. Additionally, or alternatively, the flow rate adjustment determination device 230 may use history matching and/or other techniques to generate one or more models representing flow rates.

Process 600 may also include determining total molar rates for a one or more flows through a flow path associated with each of the flow control devices (block 620). For example, the flow rate adjustment determination device 230 may determine total molar rates for a plurality of flows through a flow path. In some implementations, the flow math may include a flow through a segment pipe on a model that is associated with each of the flow control devices 220 (e.g., based on the data and/or models from step 610). As described herein the flow rate adjustment determination device 230 may determine total molar rates for any variety of constraints. More specifically, embodiments of the present method may determine the total molar rate G t of a segment (e.g., a boundary segment or any other segment in a wellbore system). As an illustrative example, for a pressure constraint, the associated total molar rate may be found by iteratively solving the residual equation:

$$P[ia] - \Delta P_f(G_t[ip]) = P_{lim} \quad (1)$$

for the unknown total molar rate $G_t[ip]$ where ip refers to the index of the segment pipe across which the friction pressure drop $\Delta P_f$ is evaluated. Similar techniques may be used to obtain total molar rates for surface rates including oil, gas, water, liquid or a downhole steam rate. In some implementations, determination of the total molar rates may take place after a converged well solution at the end of a particular well newton.

Process may further include determining flow control device constraints based on the total molar rates for the flow control devices (block 630). As described herein, the flow rate adjustment determination device 230 may determine constraints (e.g., an initial set of constraints) for the flow control devices 220. In some implementations, the flow control device constraints may be based on a total molar rate for a given surface rate limit (e.g., for a surface oil rate limit, a surface gas rate limit, a surface water rate limit, a surface liquid rate limit, a surface steam rate limit, a surface water cut limit, a surface gas-oil ratio limit, economic limits, engineering limits including drawdown limits, and/or other custom and/or proprietary limits that an oilfield operator may consider helpful for determining well control). More specifically, the volume per mole for a surface rate may be calculated, and the surface rate limit may be divided by the volume per mole to determine the constraint for that surface rate. To determine the volume per mole for each surface rate, the total molar rates across the segment pipe (e.g., as determined at block 620), is divided by the actual surface flow rate (e.g., as determined at block 610). That is, the volume per mole for each surface rate (e.g., for oil, gas, water, liquid, or steam) may be determined as follows:

$$\text{oil volume per mole} = \frac{\text{actual oil surface flow rate}}{\text{total molar rate across the segment pipe}} \quad (2)$$

$$\text{gas volume per mole} = \frac{\text{actual gas surface flow rate}}{\text{total molar rate across the segment pipe}} \quad (3)$$

-continued $$\text{water volume per mole} = \frac{\text{actual water surface flow rate}}{\text{total molar rate across the segment pipe}} \quad (4)$$

$$\text{liquid volume per mole} = \frac{\text{actual liquid surface flow rate}}{\text{total molar rate across the segment pipe}} \quad (5)$$

$$\text{steam volume per mole} = \frac{\text{actual steam downhole flow rate}}{\text{total molar rate across the segment pipe}} \quad (6)$$

where "total molar rate across the segment pipe" refers to the currently measured or calculated molar rate.

In turn, for a particular constraint limit (which may be specified for any variety of reasons, in addition to or instead of those described above with respect to FIGS. 4 and 5), the associated total molar rate can be found by simply dividing the limit by the particular current volume per mole, as follows:

$$\text{associated total molar rate for a surface oil rate limit} = \frac{\text{specified oil rate limit}}{\text{oil volume per mole}} \quad (7)$$

$$\text{associated total molar rate for a surface gas rate limit} = \frac{\text{specified gas rate limit}}{\text{gas volume per mole}} \quad (8)$$

$$\text{associated total molar rate for a surface water rate limit} = \frac{\text{specified water rate limit}}{\text{water volume per mole}} \quad (9)$$

$$\text{associated total molar rate for a surface liquid rate limit} = \frac{\text{specified liquid rate limit}}{\text{liquid volume per mole}} \quad (10)$$

$$\text{associated total molar rate for a downhole steam rate limit} = \frac{\text{specified steam rate limit}}{\text{steam volume per mole}} \quad (11)$$

The sign of the flow rate may be factored out of calculations from equations seven through 11 such that these associated total molar rates may refer to inflow or outflow to/from the reservoir or simply flow direction through a particular flow control device 220. Once associated total molar rates for the constraints specified on a particular downhole flow control device have been determined as described above, the constraints may be sorted (e.g., bubble sorted) such that the smallest associated total molar rate amongst all specified constraints is the highest ranked constraint. As described herein, the adjusted control mode (e.g., an adjusted flow rate) may be the most restrictive constraint amongst all specified constraints on a flow control device 220 which corresponds to this highest ranked constraint.

Process 600 may also include determining whether a wellhead constraint is violated by solving the well flow rates based on the initial flow control device constraints (block 640). For example, the flow rate adjustment determination device 230 may solve the well (e.g., by solving for the one or more wellhead constrains) by solving for segment constraints (e.g., initial flow control device constraints within the same control mode loop as the wellhead/tubinghead constraints). An example operation for solving the constraints is as follows:

```
//==========================================================
// Repeated well solves allow the most constraining limit to be found
//==========================================================
for (int lim_switch = 0; lim_switch < max_lim_switch; ++lim_switch)
{
   bool solve_ok = WellNewtonMV::wnewton_cntlr
   ...
   if ( !WellConstraintMV::check_limits( core_data ) )
   {
      if (!(well_spec(WSP::I_NBNDSEG) > 0 && WellConstraintMV::check_bndseg_limits(core_data, nctmbs)))
         break;
   }
}
```

This block of example pseudo C++ code may demonstrate that the wellhead or tubing head constraints, which may be determined in the calculation technique WellConstraintMV::check_limits (core_data), may take precedence over all other down hole constraints, which may be determined in the calculation technique WellConstraintMV::check_bndseg_limits(core_data, nctmbs). Further one or more downhole constraints assigned to one or more downhole flow control devices 220 may be solved either individually or simultaneously according to the ranking methods outlined herein. When the above operation is executed and the "break" shown above is finally executed, the well may be considered to be solved such that all surface constraints specified at both the well or tubing head and all downhole flow control device constraints are achieved and compatible with any physical principles (e.g. mass and energy conservation) and/or other considerations in determining models of the well and reservoir for purposes of controlling the wells during a simulation or in real-time field operations If, for example, one or more of the wellhead constraints have not been satisfied and there is a violation of one of the wellhead constraints based on the initial set of constraints (block 650—YES), process 600 includes re-solving the well (block 660). For example, the flow rate adjustment determination device 230 may iteratively adjust one or more of the initial flow control device constraints as described herein (e.g., either within the example technique WellConstraintMV::check bndseg_limits or other similar step in the iterative solution of the well) and iteratively re-solve the well. Process 600 may return to block 650 and the re-solving and constraint adjustment process may continue until check_limits returns a false status, signifying that the wellhead constraints have been satisfied and no more wellhead constraints are violated (block 650—NO). In this way, the flow rate adjustment determination device 230 may obtain unique flow device constraints and adjust flows based on those constraints (e.g., based on a convergence of the flow device constraints from repeatedly re-solving the well).

Once a wellhead false status is returned, process 600 may include determining and adjusting the flow based on the solved well without wellhead constraint violations (block 670). For example, the flow rate adjustment determination device 230 may check the device (as modelled by segments or otherwise) limits in check_bndseg_limits. In some implementations, these limits may be evaluated simultaneously as outlined above, then possible subsequent re-solves of the well may be used to check if wellhead constraints have been affected by a change in any of the downhole flow control device constraints. The simultaneous evaluation of multiple downhole flow control devices each with a set of constraints allows the above loop to converge relatively quickly and accurately. Without the simultaneous evaluation of the multiple downhole flow control device constraints as outlined in previous paragraphs, it is possible that convergence of the constraints and physical principles may not be achieved.

Process 600 may further include executing a computer-based instruction to adjust flow control device settings based on determined adjusted flow (block 680). For example, the flow rate adjustment determination device 230 may execute a computer-based or other instruction to electronically, and/or hydraulically adjust one or more flow control devices 220 based on the adjusted flow that was determined from the unique constraints (e.g., the constraints obtained at block 670). Additionally, or alternatively, the flow rate adjustment determination device 230 may execute a computer-based instruction that generates a printable and/or electronically displayed report having instructions for manually adjusting the one or more flow control devices 220. In this way, the flow rate adjustment determination device 230 may determine adjusted flow rates based on flow control device constraints that do not violate wellhead constraints. Further, the adjusted flow rates may be determined in a relatively complex wellhead system having numerous branches and segments.

Embodiments of the present method of simultaneous evaluation of downhole device constraints can be applied in real-time field operations. The well may have instrumentation to acquire the pressure-volume-temperature (PVT) at the measured depth of a particular downhole flow control device. Also local flow rates may be measured. If this data is available, then immediate settings could be applied to the device based on the most restrictive limiting constraint. If some downhole monitoring is available but not sufficient to accurately predict local PVT and flow conditions, then a well model may be tuned to the particular situation and the above methods applied. Also, in large-scale reservoir simulations with multiple wells, each with multiple laterals and downhole devices, enhancement of wells in a group or geological compartment is possible because of the robust and quick nature of these calculations described herein.

In some implementations, equivalent molar rates for all pressure and rate constraints assigned to a boundary segment or device flow path may be calculated given the latest surface or downhole fluid volumes/mole from the last well newton. For example, if the boundary segment has a surface gas rate production limit, then the actual gas surface volume/mole at the start node is available from a separator flash at the end of the last well newton. The limit is then divided by this quantity to give an equivalent molar rate for this constraint at the start of the current well newton. An equivalent molar rate for a pressure constraint is obtained by solving $P[ia] - \Delta P_f(G_t) = P_{ext}$. This set of molar rates may be ranked with the smallest total molar rate being the most limiting constraint. The resultant control mode for that boundary segment may then be passed back to a loop associated with converging both boundary segment, device and wellhead/tubing head constraints where convergence is considerably enhanced. An example loop in which convergence may be determined is described above with respect to process block 640.

Figure 7:
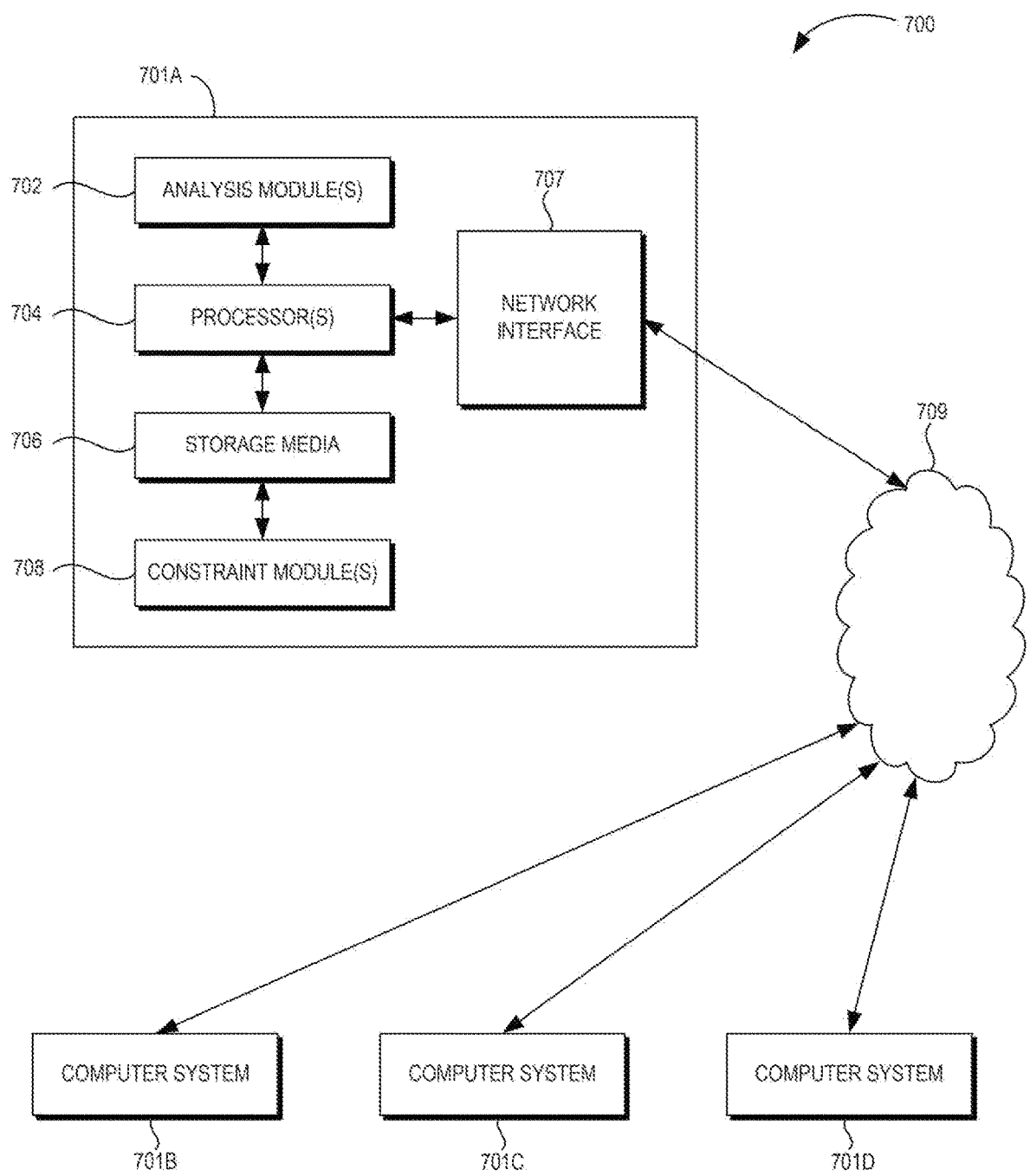
FIG. 7 illustrates a schematic view of a computing system, according to an embodiment.

In some embodiments, the methods of the present disclosure may be executed by a computing system. FIG. 7 illustrates an example of such a computing system 700, which may include one or more components of the flow rate adjustment determination device 230, in accordance with some embodiments. The computing system 700 may include a computer or computer system 701A, which may be an individual computer system 701A or an arrangement of distributed computer systems. The computer system 701A includes one or more analysis modules 702 that are configured to perform various tasks according to some embodiments, such as one or more methods disclosed herein. To perform these various tasks, the analysis module 702 executes independently, or in coordination with, one or more processors 704, which is (or are) connected to one or more storage media 706. The processor(s) 704 is (or are) also connected to a network interface 706 to allow the computer system 701A to communicate over a data network 709 with one or more additional computer systems and/or computing systems, such as 701B, 701C, and/or 701D (note that computer systems 701B, 701C and/or 701D may or may not share the same architecture as computer system 701A, and may be located in different physical locations, e.g., computer systems 701A and 701B may be located in a processing facility, while in communication with one or more computer systems such as 701C and/or 701D that are located in one or more data centers, and/or located in varying countries on different continents).

A processor may include a microprocessor, microcontroller, processor module or subsystem, programmable integrated circuit, programmable gate array, or another control or computing device.

The storage media 706 may be implemented as one or more computer-readable or machine-readable storage media. Note that while in the example embodiment of FIG. 5 storage media 706 is depicted as within computer system 701A, in some embodiments, storage media 706 may be distributed within and/or across multiple internal and/or external enclosures of computing system 701A and/or additional computing systems. Storage media 706 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 700 contains one or more well constraint module(s) 708. In the example of computing system 700, computer system 701A includes the well constraint module 708. In some embodiments, a single well constraint module may be used to perform some aspects of one or more embodiments of the methods disclosed herein. In other embodiments, a plurality of well constraint modules may be used to perform some aspects of methods herein.

It should be appreciated that computing system 700 is merely one example of a computing system, and that computing system 700 may have more or fewer components than shown, may combine additional components not depicted in the example embodiment of FIG. 5, and/or computing system 700 may have a different configuration or arrangement of the components depicted in FIG. 5. The various components shown in FIG. 5 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 700, FIG. 7), and/or through manual control by a user who may make determinations regarding whether a given step, action, template, model, or set of structure has become sufficiently accurate for the evaluation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principals of the disclosure and its practical applications, to thereby enable others skilled in the art to best utilize the disclosed embodiments and various embodiments with various modifications as are suited to the particular use contemplated.

What is claimed is:

1. A method for determining flow control device settings, comprising:
    obtaining data representing flow rates for a plurality of flow control devices;
    determining total molar rates for a plurality of flows through pipe segments associated with the flow control devices based on the obtained data;
    determining initial flow control device constraints based on the total molar rates for the plurality of flow control devices;
    sorting the initial flow control device constraints such that a smallest of the total molar rates is a highest ranked of the initial flow control device constraints;

determining that one or more wellhead constraints would be violated based on the initial flow control device constraints;

determining adjusted flow control device constraints that result in the satisfaction of the one or more wellhead constraints or constraints of others of the plurality of flow control devices;

determining an adjusted flow rate based on the adjusted flow control device constraints, wherein the adjusted flow rate corresponds to the highest ranked of the initial flow control device constraints; and executing a computer-based instruction to set one or more wellhead settings and flow control device valve settings based on the adjusted flow control device constraints.

2. The method of claim 1, wherein the data further represents pressure-volume-temperature characteristics for the plurality of flow control devices.

3. The method of claim 1, further comprising determining boundary segment constraints or the initial or adjusted flow control device constraints based on most-restrictive of the initial or adjusted flow control device constraints, and wherein the determining the initial flow control device constraints comprises determining a ranking of the initial flow control device constraints.

4. The method of claim 3, wherein the adjusted flow control device constraints are further based on the boundary segment constraints or the initial flow control device constraints.

5. The method of claim 1, wherein the determining the adjusted flow control device constraints further comprises:

solving for the one or more wellhead constraints based on a current wellhead and/or tubinghead and the initial flow control device constraints;

determining that one or more initial flow control device constraints violate one or more wellhead constraints based on the solving; and iteratively adjusting the initial flow control device constraints and re-solving for the one or more wellhead constraints until the one or more wellhead constraints are satisfied.

6. The method of claim 1, wherein the initial flow control device constraints comprise surface rate limits.

7. The method of claim 6, wherein the surface rate limits include at least one from the group consisting of:
a surface oil rate limit;
a surface gas rate limit;
a surface water rate limit;
a surface liquid rate limit;
a steam rate limit;
a surface water cut limit;
a surface gas-oil ratio limit;
an economic limit; and
an engineering limits including a drawdown limit.

8. A computing system, comprising:
one or more processors; and
a memory system comprising one or more non-transitory computer-readable media storing instructions that, when executed by at least one of the one or more processors, cause the computing system to perform operations, the operations comprising:

obtaining data representing flow rates for a plurality of flow control devices;

determining total molar rates for a plurality of flows through pipe segments associated with each of the flow control devices based on the obtained data;

determining initial flow control device constraints based on the total molar rates for the plurality of flow control devices;

sorting the initial flow control device constraints such that a smallest of the total molar rates is a highest ranked of the initial flow control device constraints;

determining that one or more wellhead constraints would be violated based on the initial flow control device constraints;

determining adjusted flow control device constraints that result in the satisfaction of one or more wellhead constraints or constraints of others of the plurality of flow control devices;

determining an adjusted flow rate based on the adjusted flow control device constraints, wherein the adjusted flow rate corresponds to the highest ranked of the initial flow control device constraints; and executing a computer-based instruction to set one or more wellhead settings and flow control device valve settings based on the adjusted flow control device constraints.

9. The computing system of claim 8, wherein the data further represents pressure-volume-temperature characteristics for the plurality of flow control devices.

10. The computing system of claim 8, wherein the operations further comprise:

determining boundary segment constraints or the initial or adjusted flow control device constraints based on most-restrictive of the initial or adjusted flow control device constraints, and wherein the determining the initial flow control device constraints comprises determining a ranking of the initial flow control device constraints.

11. The computing system of claim 10, wherein the adjusted flow control device constraints are further based on the boundary segment constraints or the initial flow control device constraints.

12. The computing system of claim 8, wherein the operations for determining the adjusted flow control device constraints further comprise:

solving for the one or more wellhead constraints based on a current wellhead and/or tubinghead and the initial flow control device constraints;

determining that one or more initial flow control device constraints violate one or more wellhead constraints based on the solving; and iteratively adjusting the initial flow control device constraints and re-solving for the one or more wellhead constraints until the one or more wellhead constraints are satisfied.

13. The computing system of claim 8, wherein the initial flow control device constraints comprise surface rate or other specified limits.

14. The computing system of claim 13, wherein the surface rates limit include at least one from the group consisting of:
a surface oil rate limit;
a surface gas rate limit;
a surface water rate limit;
a surface liquid rate limit;
a steam rate limit;
a surface water cut limit;
a surface gas-oil ratio limit;
an economic limit; and
an engineering limits including a drawdown limit.

15. A non-transitory computer-readable medium storing instructions that, when executed by one or more processors of a computing system, cause the computing system to perform operations, the operations comprising:
- obtaining data representing flow rates for a plurality of flow control devices;
- determining total molar rates for a plurality of flows through pipe segments associated with each of the flow control devices based on the obtained data;
- determining initial flow control device constraints based on the total molar rates for the plurality of flow control devices;
- sorting the initial flow control device constraints such that a smallest of the total molar rates is a highest ranked of the initial flow control device constraints;
- determining that one or more wellhead constraints would be violated based on the initial flow control device constraints;
- determining adjusted flow control device constraints that result in the satisfaction of one or more wellhead constraints or constraints of others of the plurality of flow control devices;
- determining an adjusted flow rate based on the adjusted flow control device constraints, wherein the adjusted flow rate corresponds to the highest ranked of the initial flow control device constraints; and
- executing a computer-based instruction to set one or more wellhead settings and flow control device valve settings based on the adjusted flow control device constraints.

* * * * *